US009420373B2

(12) United States Patent
Lee et al.

(10) Patent No.: US 9,420,373 B2
(45) Date of Patent: Aug. 16, 2016

(54) DISPLAY APPARATUS, HEARING LEVEL CONTROL APPARATUS, AND METHOD FOR CORRECTING SOUND

(71) Applicant: SAMSUNG ELECTRONICS CO., LTD., Suwon-si (KR)

(72) Inventors: Seung-su Lee, Suwon-si (KR); Jae-hwan Kim, Suwon-si (KR); Gi-choon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 13/849,944

(22) Filed: Mar. 25, 2013

(65) Prior Publication Data

US 2013/0314524 A1 Nov. 28, 2013

(30) Foreign Application Priority Data

May 25, 2012 (KR) ........................ 10-2012-0055720

(51) Int. Cl.

| | |
|---|---|
| ***H03G 5/00*** | (2006.01) |
| ***H04N 7/18*** | (2006.01) |
| ***H04N 9/47*** | (2006.01) |
| ***H04R 3/04*** | (2006.01) |

(Continued)

(52) U.S. Cl.

CPC .. *H04R 3/04* (2013.01); *H04R 5/04* (2013.01); *H04R 2430/01* (2013.01); *H04S 7/302* (2013.01); *H04S 2400/13* (2013.01)

(58) Field of Classification Search

CPC ............................................. H04R 3/04-3/12
USPC ............................................ 348/77; 381/101
See application file for complete search history.

(56) References Cited

U.S. PATENT DOCUMENTS

| | | | |
|---|---|---|---|
| 7,190,795 | B2 | 3/2007 | Simon |
| 7,561,935 | B2 | 7/2009 | Chung |

(Continued)

FOREIGN PATENT DOCUMENTS

| | | | |
|---|---|---|---|
| JP | 20003182 | A | 1/2000 |
| JP | 2011244431 | A | 12/2011 |

(Continued)

OTHER PUBLICATIONS

Brant et al. 1996, Risk Factors Related to Age-Associated Hearing Loss in the Speech Frequencies, J. Am Acad Audiol 7: 152-160.*

(Continued)

*Primary Examiner* — Geepy Pe
*Assistant Examiner* — Richard A Hansell, Jr.
(74) *Attorney, Agent, or Firm* — Sughrue Mion, PLLC

(57) ABSTRACT

A display apparatus, a hearing level control apparatus, and a method for correcting sound are provided. The display apparatus includes an audio output unit which outputs an audio signal as an audible sound; a storage unit which matches hearing levels of a plurality of users, which are measured according to frequencies, with face images of the plurality of users and stores the hearing levels and the face images; a photographing unit which captures faces of the plurality of users; and a controller which reads a plurality of hearing levels, which respectively match a plurality of face images generated by the photographing unit, from the storage unit and controls the audio output unit to output the audio signal according to an output hearing level calculated based on the read plurality of hearing levels.

23 Claims, 9 Drawing Sheets

(51) Int. Cl.
*H04R 5/04* (2006.01)
*H04S 7/00* (2006.01)

(56) References Cited

U.S. PATENT DOCUMENTS

| | | | | |
|---|---|---|---|---|
| 7,564,979 | B2 | 7/2009 | Swartz | |
| 2003/0064746 | A1* | 4/2003 | Rader | H04R 25/70 455/550.1 |
| 2004/0202341 | A1* | 10/2004 | Ludvigsen | H04R 25/356 381/321 |
| 2006/0149402 | A1 | 7/2006 | Chung | |
| 2006/0161282 | A1 | 7/2006 | Chung | |
| 2006/0161283 | A1 | 7/2006 | Chung | |
| 2007/0160222 | A1* | 7/2007 | Trepte | H04S 7/302 381/61 |
| 2011/0154385 | A1* | 6/2011 | Price | H04H 60/45 725/12 |
| 2011/0200217 | A1* | 8/2011 | Gurin | A61B 5/123 381/320 |
| 2011/0235807 | A1* | 9/2011 | Hayashi | H04R 5/04 381/17 |
| 2011/0286614 | A1 | 11/2011 | Hess | |
| 2012/0027227 | A1* | 2/2012 | Kok | H03G 3/32 381/107 |
| 2012/0128178 | A1* | 5/2012 | Fujii | G10L 21/02 381/98 |

FOREIGN PATENT DOCUMENTS

| | | | |
|---|---|---|---|
| KR | 1020060079128 | A | 7/2006 |
| KR | 1020060081424 | A | 7/2006 |
| WO | 02/41664 | A2 | 5/2002 |

OTHER PUBLICATIONS

Goelzer, B. , C.H. Hansen, and G. Sehrndt, "Occupational exposure to noise: evaluation, prevention, and control", World Health Organization, 2001. Available via http://www.who.int/occupational_health/publications/occupnoise/en/.*

Brant et al. 1996, Risk Factors Related to Age-Associated Hearing Loss in the Speech Frequencies, J. Am Acad Audiol 7:152-160 (Furnished on previous Office Action—Mar. 6, 2015).*

Communication dated Oct. 29, 2014 issued by the European Patent Office in counterpart European Patent Application No. 13 160 484.5.

Extended European Search Report, dated Sep. 17, 2013, issued by the European Patent Office, in counterpart Application No. 13160484.5.

* cited by examiner

DISPLAY APPARATUS, HEARING LEVEL CONTROL APPARATUS, AND METHOD FOR CORRECTING SOUND

CROSS-REFERENCE TO RELATED APPLICATION

This application claims priority from Korean Patent Application No. 10-2012-0055720, filed on May 25, 2012, in the Korean Intellectual Property Office, the disclosure of which is incorporated herein by reference in its entirety.

BACKGROUND

1. Field

Apparatuses and methods consistent with the exemplary embodiments relate to a display apparatus, a hearing level control apparatus, and a method for correcting sound, and more particularly, to a display apparatus which corrects sound according to hearing characteristics of a plurality of users, a hearing level control apparatus, and a method for correcting sound.

2. Description of the Related Art

A conventional display apparatus adjusts an audio equalizer according to a hearing characteristic of a user in order to correct and output sound appropriate for the hearing characteristic of the corresponding user.

However, the conventional display apparatus only considers a hearing characteristic of a single user when correcting sound appropriate for the corresponding hearing characteristic. The conventional display apparatus cannot correct an output sound so that a plurality of users are satisfied and does not take into in consideration the hearing characteristics of the plurality of users.

Since users have different hearing characteristics according to their individual characteristics, one user may hear a high sound well, and another user may hear a low sound well. If a user who hears a low sound well and a plurality of users who hear a high sound well are watching television (TV), the conventional display apparatus corrects and outputs sound appropriate for a hearing characteristic of the user who hears the low sound well.

If the conventional display apparatus corrects and outputs sound appropriate for the hearing characteristic of the user who hears the low sound well, the user who hears the low sound well can raise the corrected sound output through a speaker. However, since the sound is corrected to be appropriate for the hearing characteristic of the user who hears the low sound well, the plurality of users who hear the high sound well may be inconvenienced with respect to the corrected sound output through the speaker.

Also, the conventional display apparatus is fixed only in a particular position to correct the sound. Therefore, if a user changes position when watching TV, the sound will not be satisfactory to the user.

SUMMARY

Exemplary embodiments address at least the above problems and/or disadvantages and other disadvantages not described above. Also, the exemplary embodiments are not required to overcome the disadvantages described above, and an exemplary embodiment may not overcome any of the problems described above.

The exemplary embodiments provide a display apparatus which corrects an output sound so as to produce sound with which a plurality of users are satisfied, in consideration of hearing characteristics of the plurality of users, a hearing level control apparatus, and a method for correcting sound.

An exemplary embodiment also provides a display apparatus which appropriately corrects sound output through a plurality of speakers according to positions and hearing characteristics of a plurality of users, a hearing level control apparatus, and a method for correcting sound According to an aspect of an exemplary embodiment, there is provided a display apparatus including: an audio output unit which outputs an audio signal as an audible sound; a storage unit which matches hearing levels of a plurality of users, which are measured according to frequencies, with face images of the plurality of users and stores the hearing levels and the face images; a photographing unit which captures faces of the plurality of users; and a controller which reads a plurality of hearing levels, which respectively match a plurality of face images generated by the photographing unit, from the storage unit and controls the audio output unit to output the audio signal according to an output hearing level calculated based on the read plurality of hearing levels.

The display apparatus may further include: a hearing level extractor which normalizes the read plurality of hearing levels to extract a common hearing level and individual hearing levels measured according to the frequencies. The controller may calculate an average hearing level of the individual hearing levels and corrects the audio signal as sound corresponding to a lowest one of the calculated average hearing level and the common hearing level.

The controller may calculate a weighted hearing level from a difference between one of the individual hearing levels corresponding to a preset condition and the average hearing level and correct the audio signal as sound corresponding to a lowest one of the calculated weighted hearing level and the common hearing level.

The display apparatus may further include: a position information acquirer which acquires position information of the plurality of users from the face images of the plurality of users. The controller may adjust one of the average hearing level and the weighted hearing level according to a weight ratio calculated based on the position information of the plurality of users and based on position information of a plurality of speakers.

The controller may compare the position information of each of the plurality of users with the position information of a first speaker of the plurality of speakers to calculate a first weight ratio of the individual hearing levels of the plurality of users, adjust one of the average hearing level and the weighted hearing level output through the first speaker according to the first weight ratio, compare the position information of each of the plurality of users with the position information of a second speaker of the plurality of speakers to calculate a second weight ratio of the individual hearing levels of the plurality of users, and adjust one of the average hearing level and the weighted hearing level output through the second speaker according to the second weight ratio.

According to another aspect of an exemplary embodiment, there is provided a hearing level control apparatus connected to an external apparatus capable of outputting sound. The hearing level control apparatus may include: a communicator which communicates with the external apparatus to receive information related to hearing levels of a plurality of users which are measured according to frequencies; a hearing level extractor which normalizes the hearing levels of the plurality of users to extract a common hearing level and individual hearing levels of the plurality of users; and a controller which calculates a hearing level corrected based on the common hearing level and the individual hearing levels and transmits the calculated hearing level to the external apparatus.

The controller may calculate an average hearing level of the individual hearing levels and transmit a lowest one of the calculated average hearing level and the common hearing level to the external apparatus.

The controller may calculate a weighted hearing level from a difference between one of the individual hearing levels corresponding to a preset condition and the average hearing level and transmit a lowest one of the weighted hearing level and the common hearing level to the external apparatus.

The hearing level control apparatus may further include: a storage unit which stores position information of a plurality of speakers related to the external apparatus. If position information of the plurality of users is received, the controller may adjust one of the average hearing level and the weighted hearing level according to a weight ratio calculated based on the received position information of the plurality of users and based on the position information of the plurality of speakers.

The controller may compare the position information of each of the plurality of users with the position information of a first speaker of the plurality of speakers to calculate a first weight ratio of the individual hearing levels of the plurality of users, adjust one of the average hearing level and the weighted hearing level output through the first speaker according to the first weight ratio, compare the position information of each of the plurality of users with the position information of a second speaker of the plurality of speakers to calculate a second weight ratio of the individual hearing levels of the plurality of users, and adjust one of the average hearing level and the weighted hearing level output through the second speaker according to the second weight ratio.

According to another aspect of an exemplary embodiment, there is provided a method for outputting an audio signal in an audible sound in a display apparatus. The method may include: capturing faces of a plurality of users of the display apparatus; generating face images of the captured faces of the plurality of users; reading a plurality of hearing levels respectively matching the generated face images from a storage unit which stores hearing levels of the plurality of users, which are measured according to frequencies, and the face images matching with hearing levels of the plurality of users; and outputting the audio signal according to a hearing level calculated based on the read plurality of hearing levels.

The method may further include: normalizing the read plurality of hearing levels to extract a common hearing level and individual hearing levels measured according to the frequencies. The outputting the audio signal may include: calculating an average hearing level of the individual hearing levels and correcting the audio signal as sound corresponding to a lowest one of the average hearing level and the common hearing level.

The outputting of the audio signal may include: calculating a weighted hearing level from a difference between one of the individual hearing levels corresponding to a preset condition and the average hearing level and correcting the audio signal as sound corresponding to a lowest one of the weighted hearing level and the common hearing level.

The method may further include: acquiring position information of the plurality of users from the face images of the plurality of users. The outputting the audio signal may include: adjusting one of the average hearing level and the weighted hearing level according to a weight ratio calculated based on the position information of the plurality of users and based on position information of a plurality of speakers.

The outputting of the audio signal may include: comparing the position information of each of the plurality of users with the position information of a first speaker of the plurality of speakers to calculate a first weight ratio of the individual hearing levels of the plurality of users and adjusting one of the average hearing level and the weighted hearing level output through the first speaker according to the first weight ratio; and comparing the position information of each of the plurality of users with the position information of a second speaker of the plurality of speakers to calculate a second weight ratio of the individual hearing levels of the plurality of users and adjusting one of the average hearing level and the weighted hearing level output through the second speaker according to the second weight ratio.

According to another aspect of an exemplary embodiment, there is provided a method for controlling hearing levels of a plurality of users in a hearing level control apparatus connected to an external apparatus capable of outputting sound. The method may include: communicating with the external apparatus to receive information related to the hearing levels of the plurality of users which are measured according to frequencies; normalizing the hearing levels of the plurality of users to extract a common hearing level and individual hearing levels of the plurality of users; and calculating a hearing level corrected based on the common hearing level and the individual hearing levels and transmitting the hearing level to the external apparatus.

The transmitting the hearing level may include: calculating an average hearing level of the individual hearing levels and transmitting a lowest one of the average hearing level and the common hearing level to the external apparatus.

The transmitting the hearing level may include: calculating a weighted hearing level from a difference between one of the individual hearing levels corresponding to a preset condition and the average hearing level and transmitting a lowest one of the weighted hearing level and the common hearing level to the external apparatus.

The transmitting the hearing level may include: if position information of the plurality of users is received, adjusting one of the average hearing level and the weighted hearing level according to a weight ratio calculated based on the received position information and based on stored position information of a plurality of speakers related to the external apparatus.

The transmitting the hearing level may include: comparing the position information of each of the plurality of users with the position information of a first speaker of the plurality of speakers to calculate a first weight ratio of the individual hearing levels of the plurality of users and adjusting one of the average hearing level and the weighted hearing level output through the first speaker according to the first weight ratio; and comparing the position information of each of the plurality of users with the position information of a second speaker of the plurality of speakers to calculate a second weight ratio of the individual hearing levels of the plurality of users and adjusting one of the average hearing level and the weighted hearing level output through the second speaker according to the second weight ratio.

As described above, according to various exemplary embodiments, a display apparatus may correct and output an output sound as sound with which a plurality of users are satisfied, in consideration of hearing characteristics of the plurality of users. Also, the display apparatus may appropriately correct and output sounds output through a plurality of speakers in consideration of the hearing characteristics and positions of the plurality of users.

BRIEF DESCRIPTION OF THE DRAWINGS

The above and/or other exemplary embodiments will be more apparent by describing certain exemplary embodiments with reference to the accompanying drawings, in which.

DETAILED DESCRIPTION OF THE EXEMPLARY EMBODIMENTS

Figure 1:
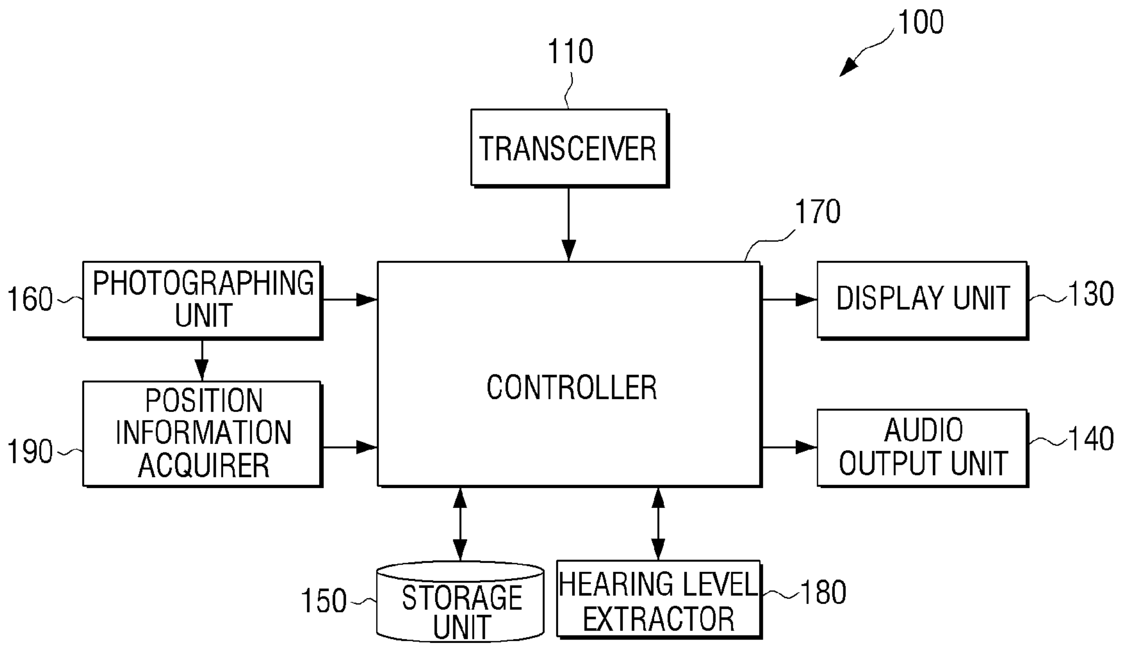
FIG. 1 is a block diagram of a display apparatus according to an exemplary embodiment.

Exemplary embodiments are described in greater detail with reference to the accompanying drawings.

In the following description, the same drawing reference numerals are used for the same elements even in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, well-known functions or constructions are not described in detail since they would obscure the exemplary embodiments with unnecessary detail.

FIG. 1 is a block diagram of a display apparatus according to an exemplary embodiment.

Referring to FIG. 1, the display apparatus 100 includes a transceiver 110, a display unit 130, an audio output unit 140, a storage unit 150, a photographing unit 160, and a controller 170.

The transceiver 110 receives content including at least one of an image signal and an audio signal from an external apparatus through a repeater, such as a set-top box or the Internet. However, the exemplary embodiment is not limited thereto. Therefore, the transceiver 110 may perform data communication with a terminal apparatus, with which a wireless communication is possible, to receive content including at least one of an image signal and an audio signal or may receive a control command from a remote control apparatus, such as a remote controller.

The display unit 130 signal-processes the image signal of the content received through the transceiver 110 and displays the signal-processed image signal on a screen. The audio output unit 140 signal-processes the audio signal of the received content as an audible sound and outputs the audible sound through a speaker. The storage unit 150 matches hearing levels of a plurality of users, measured according to frequencies, with face images and stores the hearing levels and the face images. The photographing unit 160 captures a face of at least one user to generate a face image of the corresponding user.

The controller 170 controls operations of a transceiver 110, a display unit 130, an audio output unit 140, a storage unit 150, and a photographing unit 160. The controller 170 may include a control program, a non-volatile memory such as read only memory (ROM) storing a control program therein, and a flash memory. The controller 170 may include volatile memory, such as a random access memory (RAM) to which at least a part of the stored control program is loaded. The controller 170 may also include a microprocessor, such as a central processing unit (CPU), and a micro control unit (MCU), which can execute the loaded control program.

Also, if face images of the plurality of users are generated through the photographing unit 160, the controller 170 reads the hearing levels of the plurality of users and matches the hearing levels of the users with the face images of the plurality of users from the storage unit 150. The controller 170 controls the audio output unit 140 to output the audio signal according to an output hearing level calculated based on the read hearing levels.

According to another aspect, the display apparatus may further include a hearing level extractor 180. In detail, the hearing level extractor 180 normalizes the hearing levels, which respectively match with the face images of the plurality of users and are read by the controller 170, to extract a common hearing level and/or individual hearing levels which are measured according to frequencies. Here, the common hearing level may be a hearing level at which the plurality of users have the same hearing characteristic, from the read hearing levels which are measured according to frequencies, and match the face images of the plurality of users. The individual hearing levels may be hearing levels at which the plurality of users have different hearing levels from the hearing levels which are measured according to the frequencies.

If at least one of the common hearing level and the individual hearing levels of the plurality of users is extracted as described above, the controller 170 corrects the audio signal as sound corresponding to the lowest one of an extracted average hearing level and the common hearing level. However, the exemplary embodiment is not limited thereto. Therefore, the controller 170 may calculate a weighted hearing level from a difference between one of individual hearing levels of a user A and a user B corresponding to a preset condition and the average hearing level, and control the audio output unit 140 to output the audio signal as sound corresponding to the lowest one of the weighted hearing level and the common hearing level.

As described above, the display apparatus according to the exemplary embodiment may correct and output an audio signal as sound which satisfies a plurality of users, since it takes into consideration the hearing characteristics of the plurality of users.

An operation of correcting an audio signal according to the hearing characteristics of a plurality of users in the display apparatus will now be described in more detail with reference to FIGS. 2 and 3.

Figure 2:
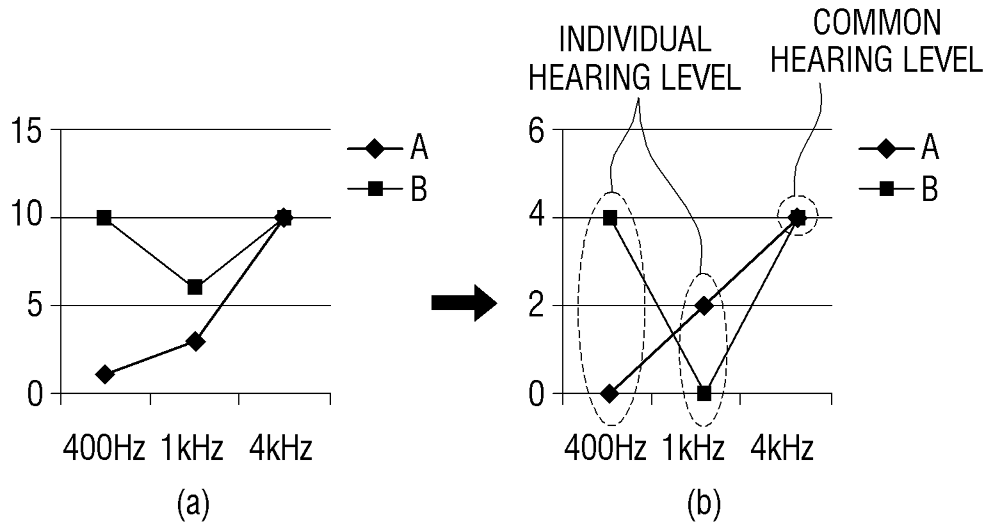
FIG. 2 is a view illustrating an operation of extracting a common hearing characteristic and individual hearing characteristics from hearing levels of a plurality of users in the display apparatus, according to an exemplary embodiment.
Figure 3:
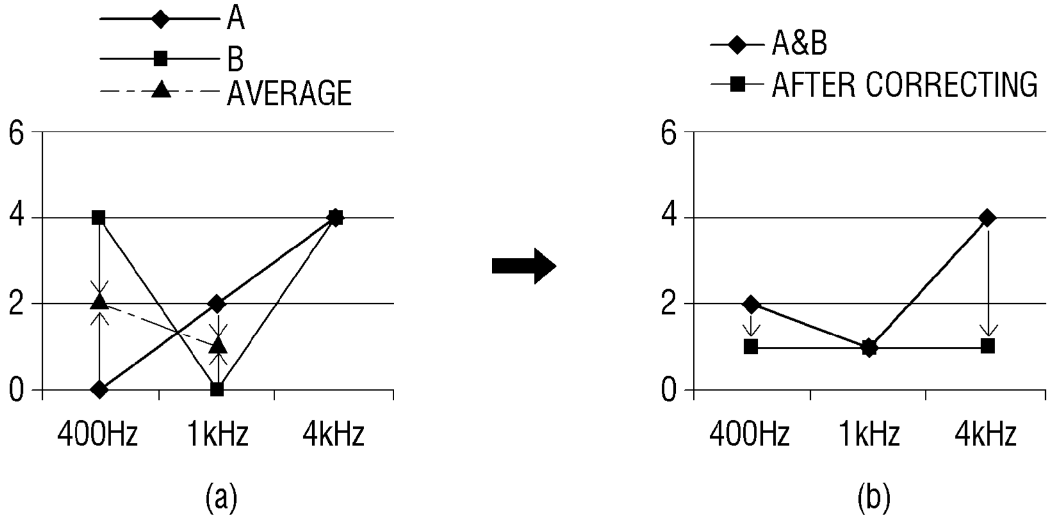
FIG. 3 is a view illustrating an operation of calculating an output hearing level in consideration of hearing levels of a plurality of users in the display apparatus, according to an exemplary embodiment.

FIG. 2 is a view illustrating an operation of extracting a common hearing characteristic and individual hearing characteristics from hearing levels of a plurality of users in the display apparatus, according to an exemplary embodiment. FIG. 3 is a view illustrating an operation of calculating an output hearing level in consideration of the hearing levels of a plurality of users in the display apparatus, according to an exemplary embodiment.

As shown in FIG. 2, hearing levels of user A and user B are measured and then stored in the storage unit 150. In detail, the hearing level of the user A is measured as about 1 in a frequency of 400 Hz and then stored in the storage unit 150. The hearing level of the user B is measured as about 10 in the frequency of 400 Hz and then stored in the storage unit 150. The hearing level of the user A is measured as about 3 in a frequency of 1 KHz and then stored in the storage unit 150. The hearing level of the user B is measured as about 6 in the frequency of 1 KHz and then stored in the storage unit 150. Also, the hearing levels of user A and user B are measured as about 10 in a frequency of 4 KHz and then stored in the storage unit 150. In another embodiment, the hearing level of the user A is measured as about 5 in a frequency of 4 KHz and then stored in the storage unit 150. As described above, with reference to the hearing levels of user A and user B, which are measured according to the frequencies and then stored in the storage unit 150, the user A hears a high sound better in the frequencies of 400 Hz and 1 KHz than the user B. Also, user A and user B hear a low sound better in the frequency of 4 KHz.

If face images of user A and user B are generated through the photographing unit 160, when the hearing levels of user A and user B are measured according to the frequencies and then stored in the storage unit 150 as described above, the controller 170 reads the hearing levels of user A and user B and matches the hearing levels of user A and user B with the face images of user A and user B from the storage unit 150. The hearing level extractor 180 normalizes the read hearing levels of the user A and user B measured according to the frequencies to extract a common hearing level and individual hearing levels.

As described above, the user A has the hearing levels of about 1, 3, and 10 in the frequencies 400 Hz, 1 KHz, and 4 KHz, respectively, and the user B has the hearing levels of about 10, 6, and 10 in the frequencies of 400 Hz, 1 KHz, and 4 KHz, respectively. Therefore, if the hearing levels of user A and user B measured according to the frequencies are read, the hearing level extractor 180 normalizes the hearing levels of user A and user B measured according to the frequencies. Through this normalizing, hearing levels of 0, 2, and 4 are extracted for the user A in the frequencies 400 Hz, 1 KHz, and 4 KHz, respectively, and hearing levels of 4, 0, and 4 are extracted for the user B in the frequencies 400 Hz, 1 KHz, and 4 KHz, respectively. If the hearing levels of user A and user B are extracted according to the frequencies through normalizing as described above, the hearing level extractor 180 extracts individual hearing levels and a common hearing level from the normalized hearing levels of the users A and B as shown in FIG. 3.

In other words, the hearing level extractor 180 extracts the individual hearing levels of user A and user B in the frequencies of 400 Hz and 1 KHz and extracts the common hearing level of user A and user B in the frequency of 4 KHz. If the individual hearing levels and the common hearing level are extracted, the controller 170 calculates an average hearing level from the individual hearing levels of user A and user B. In other words, the controller 170 calculates an average hearing level 2 from individual hearing levels 0 and 4 of user A and user B extracted in the frequency of 400 Hz and an average hearing level 1 from individual hearing levels 2 and 0 of user A and user B extracted in the frequency of 1 KHz.

If an average hearing level of user A and user B is calculated as described above, the controller 170 acquires the lowest one of either the average hearing level or the common hearing level of user A and user B. In other words, the controller 170 compares the average hearing level 2 calculated in the frequency of 400 KHz and the average hearing level 1 calculated in the frequency of 1 KHz with the common hearing level 4 calculated in the frequency of 4 KHz in order to determine that the average hearing level calculated in the frequency of 1 KHz is the lowest hearing level. Therefore, as shown in (a) of FIG. 3, the controller 170 determines a hearing level, with which both user A and user B are satisfied, as the hearing level 1. As shown in (b) of FIG. 3, the controller 170 determines hearing levels according to the frequencies as the hearing level 1.

If hearing characteristics of user A and user B are determined as one factor, i.e., the hearing level 1, as described above, the controller 170 controls the audio output unit 140 to correct and output sound of the audio signal via the speaker as sound corresponding to the hearing level 1. Therefore, the audio output unit 140 corrects the audio signal as sound corresponding to the hearing level 1 and outputs the corrected sound according to a control command of the controller 170.

According to another aspect of an exemplary embodiment, the display apparatus may further include a position information acquirer 190 which acquires position information of the plurality of users from the face images of the plurality of users. In detail, if the face images of the plurality of users are generated through the photographing unit 160, the position information acquirer 180 acquires information about positions of the plurality of users from the generated face images. This technology for acquiring position information of a user from a face image is known and thus is not described in detail in the exemplary embodiment.

If the position information of the plurality of users are acquired through the position information acquirer 190, the controller 170 adjusts the average hearing level or the weighted hearing level according to a weight ratio calculated based on the position information of the plurality of users and position information of a plurality of speakers. In detail, the storage unit 150 stores position information of places in where the plurality of speakers are disposed. Therefore, if the position information of the plurality of users are acquired through the position information acquirer 190, the controller 170 calculates a weight ratio of a hearing level related to sounds which are to be respectively output from the plurality of speakers, based on the position information of the plurality of users and the position information of the plurality of speakers stored in the storage unit 150. The controller 170 adjusts the average hearing level or the weighted hearing level according to the calculated weight ratio. Therefore, the audio output unit 140 appropriately corrects and outputs the sounds output from the plurality of speakers according to the adjusted hearing level.

In detail, the controller 170 compares the position information of each of the plurality of users with the position information of the first speaker of the plurality of speakers to calculate a first weight ratio of the individual hearing levels of the plurality of users and adjusts the average hearing level or the weighted hearing level output through the first speaker according to the calculated first weight ratio. The controller 170 also compares the position information of each of the plurality of users with the position information of the second speaker of the plurality of speakers to calculate a second weight ratio of the individual hearing levels of the plurality of users and adjusts the average hearing level or the weighted hearing level output through the second speaker according to the calculated second weight ratio.

An operation of correcting and outputting sounds output through the plurality of speakers according to the position information of the plurality of users in the display apparatus according to an exemplary embodiment will now be described in more detail with reference to FIGS. 4 through 6.

Figure 4:
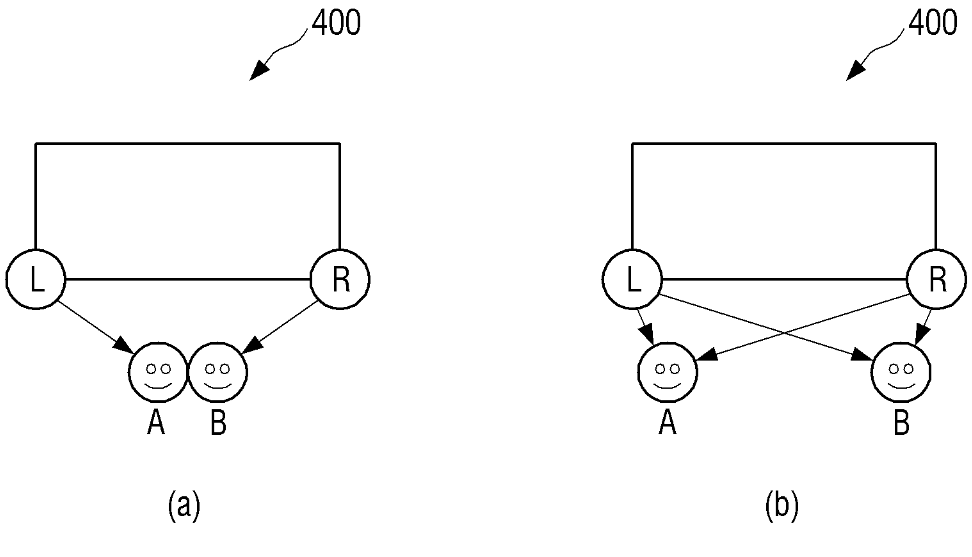
FIG. 4 is a view illustrating positions of a plurality of users in front of the display apparatus according to an exemplary embodiment.

FIG. 4 is a view illustrating positions of the plurality of users in front of the display apparatus according to an exemplary embodiment. FIG. 5 is a view illustrating an operation of giving weights to the hearing levels of the plurality of users according to the position information of the plurality of users in the display apparatus, according to an exemplary embodiment. FIG. 6 is a view illustrating an operation of calculating an output hearing level based on the weights given according to the position information of the plurality of users in the display apparatus, according to an exemplary embodiment.

As shown in FIG. 4, the display apparatus 400 outputs sound through first speaker L and second speaker R disposed on left and right sides of display apparatus 400. However, the exemplary embodiment is not limited thereto. Therefore, a third speaker may be disposed in another direction. An operation of appropriately correcting and outputting sound through first speaker L and second speaker R disposed on the left and right sides of the display apparatus will be described in the exemplary embodiment.

The plurality of users may be in the same position or in different positions. As shown in (a) of FIG. 4, user A and user B may be positioned towards a center of the display apparatus 400. Alternatively, as shown in (b) of FIG. 4, the user A may be in a position adjacent to the first speaker L of the display apparatus 400, and the user B may be in a position adjacent to the second speaker R of the display apparatus 400. According to an exemplary embodiment, if user A and user B are positioned in the center of the display apparatus as shown in (a) of FIG. 4, the controller 170 may apply a weight ratio equally, i.e., 50:50. If the weight ratio is applied equally as described above, the audio output unit 140 corrects the audio signal as sound corresponding to the lowest one of the calculated average hearing level or the weighted hearing level and the common hearing level, as described above. Therefore, the first speaker L and the second speaker R output the audio signal as the same sound which has been corrected. For example, if the hearing levels of user A and user B are determined as a hearing level 1 with which both user A and user B are satisfied, the first speaker L and the second speaker R output the audio signal which has been corrected as the sound corresponding to the determined hearing level 1.

According to another exemplary embodiment, if the user A is in the position adjacent to the first speaker L of the display apparatus, and the user B is in the position adjacent to the second speaker R of the display apparatus, as shown in (b) of FIG. 4, the controller 170 may apply a weight to the hearing level of the user A in the position adjacent to the first speaker L and a weight to the hearing level of the user B in the position adjacent to the second speaker R. In detail, as shown in FIG. 5, if the user A is in the position adjacent to the first speaker L, the controller 170 applies a ratio between the weights of the hearing levels of user A and user B as 75:25. According to this weight ratio, the normalized average hearing level calculated in the frequencies of 400 Hz and 1 KHz may be adjusted to a hearing level approximate to the hearing level of the user A.

Therefore, the controller 170 calculates hearing levels related to the sound output through the first speaker L according to frequencies. In other words, the hearing levels related to the sound output through the first speaker L may be 1, 1.5, and 4. If the hearing levels related to the sound output through the first speaker L are calculated as described above, the controller 170 determines the lowest hearing level from the calculated hearing levels. In other words, as shown in FIG. 6, if the lowest one of the hearing levels calculated in relation to the sound output through the first speaker L is determined as a hearing level calculated in the frequency of 400 Hz, the controller 170 corrects an audio signal output from the first speaker L as sound corresponding to the hearing level 1 calculated in the frequency of 400 Hz. Therefore, the audio output unit 140 outputs the audio signal corrected as the sound corresponding to the hearing level 1 through the first speaker L.

Figure 5:
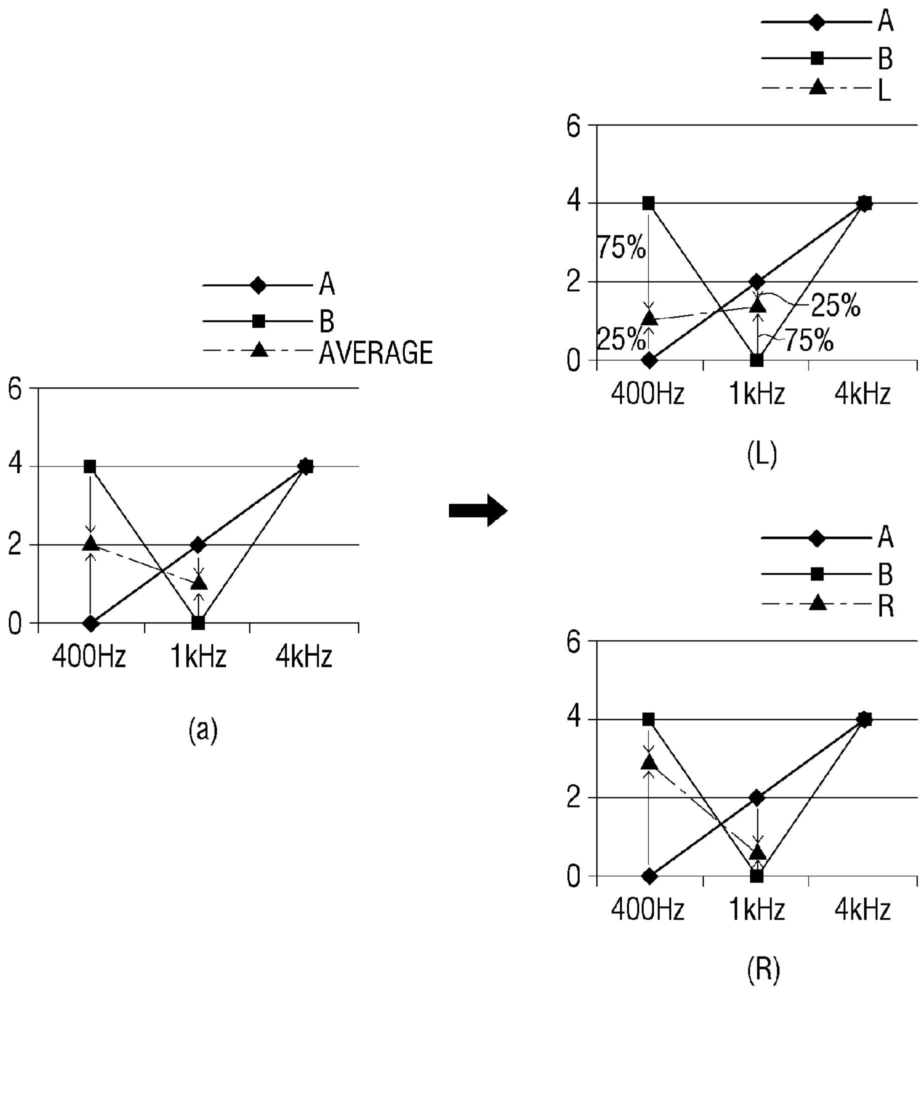
FIG. 5 is a view illustrating an operation of giving weights to the hearing levels of the plurality of users according to positions of the plurality of users in the display apparatus, according to an exemplary embodiment.
Figure 6:
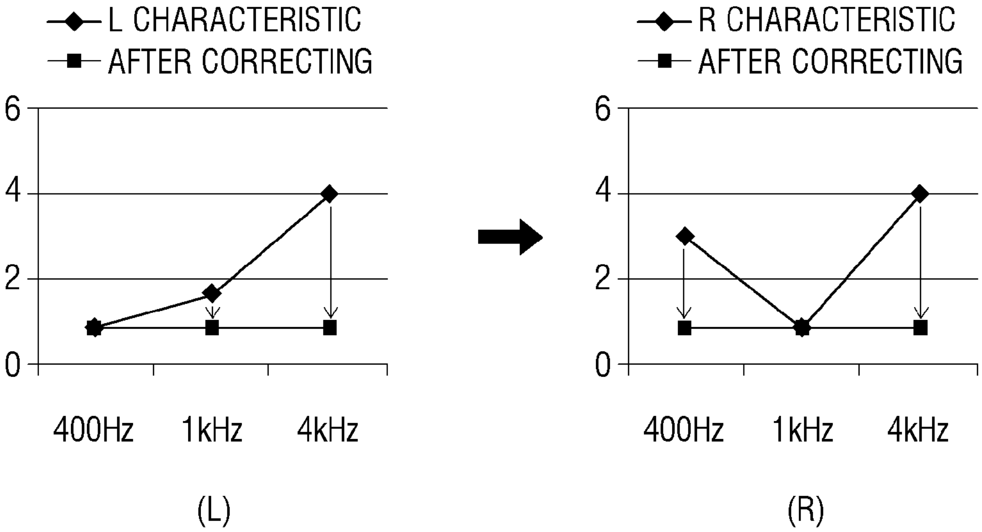
FIG. 6 is a view illustrating an operation of calculating an output hearing level based on weights given according to the positions of the plurality of users in the display apparatus, according to an exemplary embodiment.

As shown in FIG. 5, if the user B is in the position adjacent to the second speaker R, the controller 170 applies the ratio between the weights of the hearing levels of user B and user A as 25:75. According to this weight ratio, the normalized average hearing levels calculated in the frequencies of 400 Hz and 1 KHz are adjusted to a hearing level approximate to the hearing level of the user B.

Therefore, the controller 170 calculates hearing levels according to frequencies in relation to sound output through the second speaker R. In other words, the hearing levels in relation to the sound output through the second speaker R may be 3, 1, and 4. If the hearing levels in relation to the sound output through the second speaker R are calculated as described above, the controller 170 determines the lowest hearing level from the calculated hearing levels. In other words, as shown in FIG. 6, if the lowest hearing level of the hearing levels calculated in relation to the sound output through the second speaker R is determined as a hearing level calculated in the frequency of 1 KHz, the controller 170 corrects an audio signal output from the second speaker R as sound corresponding to the hearing level 1 calculated in the frequency of 1 KHz. Therefore, the audio output unit 140 outputs the audio signal corrected as sound corresponding to the hearing level 1 through the second speaker R.

As described above, the display apparatus according to the exemplary embodiment corrects and outputs sound through a speaker as sound corresponding to a hearing level, with which a plurality of users are satisfied, based on hearing characteristics of the plurality of users. Also, the display apparatus appropriately corrects and outputs sound through a plurality of speakers in consideration of positions of the plurality of users.

The operation of correcting sound output through a speaker according to hearing characteristics and positions of a plurality of users in the display apparatus has been described. An operation of correcting sound output from an external apparatus capable of outputting sound according to hearing characteristics and position information of a plurality of users in a hearing level control apparatus connected to the external apparatus will now be described in detail.

Figure 7:
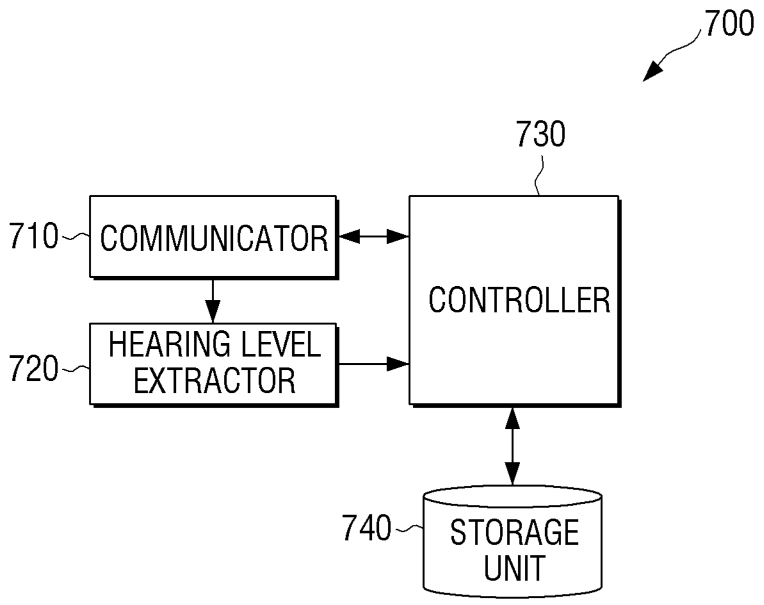
FIG. 7 is a block diagram of a hearing level control apparatus connected to an external apparatus capable of outputting sound, according to an exemplary embodiment.

FIG. 7 is a block diagram of a hearing level control apparatus connected to an external apparatus capable of outputting sound, according to an exemplary embodiment.

Referring to FIG. 7, the hearing level control apparatus 700 includes a communicator 710, a hearing level extractor 720, and a controller 730.

The communicator 710 communicates with an external apparatus to receive information related to hearing levels of a plurality of users measured according to frequencies. Here, the hearing level-related information is information about measured hearing characteristics of the plurality of users. For example, the hearing level of the user A may be measured as 1 in the frequency of 400 Hz, and the hearing level of the user B may be measured as 10 in the frequency of 10 Hz. In this case, the user A hears a high sound better than the user B in the frequency of 400 Hz.

The hearing level extractor 720 normalizes the hearing levels of the plurality of users to extract a common hearing level and individual hearing levels of the plurality of users. The controller 730 calculates a corrected hearing level based on the common hearing level and the individual hearing levels of the plurality of users extracted by the hearing level extractor 720 and transmits the corrected hearing level to the external apparatus through the communicator 710. In detail, the controller 730 calculates an average hearing level of the individual hearing levels of the plurality of users and transmits the lowest of either the calculated average hearing level and the common hearing level to the external apparatus.

However, the exemplary embodiment is not limited thereto. Therefore, the controller 730 may calculate a weighted hearing level from a difference between the individual hearing levels corresponding to a preset condition or the average hearing level and transmit the lowest the calculated weighted hearing level and the common hearing level to the external apparatus. As described above, the hearing level control apparatus according to the exemplary embodiment may control the external apparatus to correct and output sound as sound with which all of a plurality of users are satisfied, based on hearing levels of the plurality of users.

For example, information related to the hearing levels of user A and user B measured in the frequencies of 400 Hz, 1 KHz, and 4 KHz may be received. Also, according to the hearing level-related information, the hearing levels of the user A measured in the frequencies of 400 Hz, 1 KHz, and 4 KHz may be 1, 3, and 10, and the hearing levels of the user B measured in the frequencies of 400 Hz, 1 KHz, and 4 KHz may be 10, 6, and 10. If the information related to the hearing levels of user A and user B measured according the frequencies is received as described above, the hearing level extractor 720 normalizes the hearing levels of user A and user B. Through this normalizing, the hearing levels of the user A may be extracted as 0, 2, and 4 in the frequencies of 400 Hz, 1 KHz, and 4 KHz, and the hearing levels of the user B may be extracted as 4, 0, and 4 in the frequencies of 400 Hz, 1 KHz, and 4 KHz. If the hearing levels of user A and user B according to the frequencies are extracted through the normalizing as described above, the hearing level extractor 720 extracts individual hearing levels and a common hearing level from the normalized hearing levels of the users A and according to the frequencies In other words, the hearing level extractor 720 extracts individual hearing levels of user A and user B in the frequencies of 400 Hz and 1 KHz and a common hearing level of user A and user B in the frequency of 4 KHz. If the individual hearing levels and the common hearing level are extracted as described above, the controller 730 calculates an average hearing level from the individual hearing levels of user A and user B. In other words, the controller 730 calculates an average hearing level 2 from the individual hearing levels 0 and 4 of user A and user B extracted in the frequency of 400 Hz and an average hearing level 1 from the individual hearing levels 2 and 0 of user A and user B extracted in the frequency of 1 KHz.

If the average hearing level of user A and user B is calculated as described above, the controller 730 acquires the lowest average hearing level or the common hearing level of user A and user B. In other words, the controller 730 compares an average hearing level 2 calculated in the frequency of 400 Hz and an average hearing level 1 calculated in the frequency of 1 KHz with a common hearing level 4 calculated in the frequency of 4 KHz to determine an average hearing level calculated in the frequency of 1 KHz as the lowest hearing level. Therefore, the controller 730 determines a hearing level, with which both user A and user B are satisfied, as the hearing level 1 and the hearing levels measured according to the frequencies as the hearing level 1 and transmits the determined hearing levels to the external apparatus.

However, the exemplary embodiment is not limited thereto. Therefore, as described above, the controller 730 may calculate a weighted hearing level from a difference between the individual hearing levels of user A and user B corresponding to a preset condition or an average hearing level and transmit the lowest one of the calculated weighted hearing level and the common hearing level to the external apparatus. Therefore, the external apparatus may correct and output sound of an audio signal output through a speaker as sound corresponding to a hearing level received from the hearing level control apparatus.

According to another aspect, the hearing level control apparatus may further include a storage unit 740 which stores position information of a plurality of speakers related to the external apparatus.

Therefore, if the position information of the plurality of users is received through the communicator 710, the controller 730 calculates a weight ratio based on the position information of the plurality of users and the position information of the plurality of speakers stored in the storage unit 740. The controller 730 adjusts the average hearing level or the weighted hearing level according to the calculated weight ratio.

In detail, the controller 730 compares the position information of each of the plurality of users with the position information of the first speaker of the plurality of speakers to calculate a first weight ratio of the individual hearing levels of the plurality of users and adjusts the average hearing level or the weighted hearing level output through the first speaker according to the first weight ratio. The controller 730 also compares the position information of each of the plurality of users with the position information of the second speaker of the plurality of speakers to calculate a second weight ratio of the individual hearing levels of the plurality of users and adjusts the average hearing level or the weighted hearing level output through the second speaker according to the second weight ratio.

For example, the external apparatus capable of outputting sound may output sound through the first speaker L and the second speaker R disposed on the left and right sides, and position information of the first speaker L and second speaker R may be stored in the storage unit 740. Therefore, if the position information of user A and user B is received, the controller 730 checks which one of the first speaker L and second speaker R is adjacent to each of user A and user B, based on the position information of the first speaker L and second speaker R stored in the storage unit 740 and the received position information of user A and user B.

According to an exemplary embodiment, if both user A and user B are positioned in the center between the first speaker L and second speaker R, the controller 730 may equally apply a weight ratio as 50:50. If the weight ratio is equally applied as described above, the controller 730 may compare the average hearing level or the weighted hearing level with the common hearing level to transmit a hearing level corresponding to the lowest hearing level to the external apparatus.

The user A may be in the position adjacent to the first speaker L, and the user B may be in the position adjacent to the second speaker R. In this case, the controller 730 may apply a weight to the hearing level of the user A in the position adjacent to the first speaker L and a weight to the user B in the position adjacent to the second speaker R.

As shown in FIG. 5, if the user A is in the position adjacent to the first speaker L, the controller 730 may apply a ratio between the weights of the hearing levels of the users A and B as 75:25. Therefore, according to this weight ratio, the controller 730 may adjust the normalized average hearing levels calculated in the frequencies of 400 Hz and 1 KHz to a hearing level approximate to the hearing level of the user A and compare the adjusted hearing level with the common hearing level to transmit a hearing level corresponding to the lowest hearing level to the external apparatus.

As also shown in FIG. 5, if the user B is in the position adjacent to the second speaker R, the controller 730 may apply the ratio between the weights of the hearing levels of user B and user A as 25:75. Therefore, according to this weight ratio, the controller 730 may adjust the normalized average hearing levels calculated in the frequencies of 400 Hz and 1 KHz to a hearing level approximate to the hearing level of the user B and compare the adjusted hearing level with the common hearing level to transmit a hearing level corresponding to the lowest hearing level to the external apparatus.

As described above, the hearing level control apparatus according to the exemplary embodiment controls the external apparatus to correct and output sound corresponding to a hearing level with which all of a plurality of users are satisfied, based on hearing characteristics of the plurality of users. Also, the hearing level control apparatus controls the external apparatus to appropriately correct and output sounds output through a plurality of speakers of the external apparatus in consideration of positions of the plurality of users.

The elements of the hearing level control apparatus for controlling the external apparatus to correct and output sound output through a speaker according to hearing characteristics and positions of a plurality of users have been described in detail.

A method for correcting sound output through a speaker according to hearing characteristics and positions of a plurality of users in the above-described display apparatus will now be described in detail.

Figure 8:
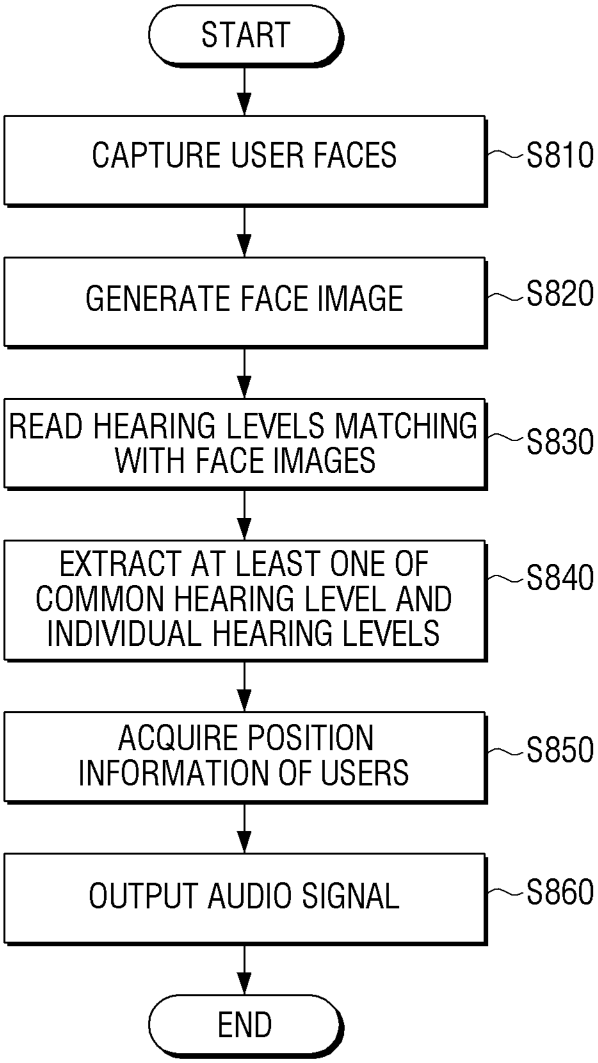
FIG. 8 is a flowchart illustrating a method for correcting and outputting sound signal-processed according to hearing levels of a plurality of users in a display apparatus, according to an exemplary embodiment.

FIG. 8 is a flowchart illustrating a method for correcting and outputting sound signal-processed according to hearing characteristics of a plurality of users in the display apparatus, according to an exemplary embodiment.

Referring to FIG. 8, in operation S810, the display apparatus captures faces of a plurality of users and in operation 820, generates face images of the captured faces of the plurality of users. Here, the display apparatus receives content including at least one of an image signal and an audio signal from the external apparatus through a repeater, such as a set-top box or the Internet. If the content is received, the display apparatus signal-processes the image signal of the received content, displays the signal-processed image data on a screen, and signal-processes the audio signal of the content to output the audio signal as an audible sound. The operation of the display apparatus for signal-processing the image and the audio signals of the content received from the external apparatus is a known technology, and thus its detailed description will be omitted in the exemplary embodiment.

If the face images of the faces of the plurality of users are generated, in operation S830, the display apparatus reads a plurality of hearing levels respectively corresponding to the generated face images from a storage unit which stores hearing levels of the plurality of users, which are measured according to frequencies and match the face images, and the face images. In operation S840, the display apparatus normalizes a plurality of the read hearing levels to extract a common hearing level and/or individual hearing levels of the hearing levels measured according to the frequencies. The display apparatus calculates an average hearing level of the individual hearing levels of the plurality of users from the common hearing level and the individual hearing levels of the plurality of users.

However, the exemplary embodiment is not limited thereto. Therefore, the display apparatus may calculate a weighted hearing level from a difference between the individual hearing levels of the plurality of users corresponding to a preset condition or the average hearing level. If the face images of the plurality of users are generated in operation S820, the display apparatus acquires position information of the plurality of users from the face images of the plurality of users in operation S850. The display apparatus calculates a weight ratio based on the position information of the plurality of users and the position information of a plurality of speakers. If the weight ratio is calculated, the display apparatus adjusts the average hearing level or the weighted hearing level according to the calculated weight ratio.

In detail, the display apparatus compares the position information of each of the plurality of users with the position information of the first speaker of the plurality of speakers to calculate a first weight ratio of the individual hearing levels of the plurality of users. The display apparatus adjusts one of the average hearing level and the weighted hearing level output through the first speaker according to the calculated first weight ratio. Also, the display apparatus compares the position information of each of the plurality of users with the position information of the second speaker of the plurality of speakers to calculate a second weight ratio of the individual hearing levels of the plurality of users. The display apparatus adjusts the average hearing level or the weighted hearing level output through the second speaker according to the calculated second weight ratio.

If the average hearing level or the weighted hearing level is adjusted as described above, the display apparatus compares the adjusted average hearing level or the adjusted weighted hearing level with the common hearing level to determine the lowest hearing level. In operation S860, the display apparatus corrects an audio signal so that the audio signal is output as sound corresponding to the determined hearing level, to output the sound of the corrected audio signal through a speaker.

As shown in FIG. 4, the display apparatus may output the sound through the first speaker L and the second speaker R disposed on the left and right sides. Also, user A and user B may be positioned in the center of the display apparatus, or the user A may be in the position adjacent to the first speaker L of the display apparatus, and the user B may be in the position adjacent to the second speaker R of the display apparatus.

According to an exemplary embodiment, if user A and user B are positioned in the center of the display apparatus, the display apparatus may apply a weight ratio equally, i.e., as 50:50. If the weight ratio is equally applied as described above, the display apparatus corrects an audio signal as sound corresponding to the lowest average hearing level or the weighted hearing level and the common hearing level. Therefore, the first speaker L and the second speaker R may output the same corrected sound.

According to another exemplary embodiment, the user A may be in the position adjacent to the first speaker L of the display apparatus, and the user B may be in the position adjacent to the second speaker R of the display apparatus. In this case, the display apparatus may apply a weight to the hearing level of the user A in the position adjacent to the first speaker L and a weight to the hearing level of the user B in the position adjacent to the second speaker R.

As shown in FIG. 5, if the user A is in the position adjacent to the first speaker L, the display apparatus may apply a ratio between the weights of the hearing levels of user A and user B as 75:25. According to this weight ratio, the display apparatus may adjust the average hearing levels respectively calculated according to frequencies to a hearing level approximate to the hearing level of the user A. If the hearing levels related to the sound output through the first speaker L are calculated according to the frequencies as described above, the display apparatus determines the lowest hearing level from the hearing levels calculated according to the frequencies and corrects and outputs the audio signal as sound corresponding to the determined hearing level through the first speaker L.

If the user B is in the position adjacent to the second speaker R, the display apparatus may apply a ratio between the weights of the hearing levels of user B and user A as 25:75. According to this weight ratio, the average hearing level may be adjusted to a hearing level approximate to the hearing level of the user B. If the hearing levels related to the sound output through the second speaker R are calculated according to the frequencies as described above, the display apparatus may determine the lowest hearing level from the hearing levels calculated according to the frequencies, and correct and output the audio signal as sound corresponding to the determined hearing level through the second speaker R.

As describe above, the display apparatus according to the exemplary embodiment corrects and outputs sound through a speaker as sound corresponding to a hearing level with which all of a plurality of users are satisfied, based on hearing characteristics of the plurality of users. Also, the display apparatus appropriately corrects and outputs sound output through a plurality of speakers in consideration of positions of the plurality of users.

The method of correcting the sound output through the speaker according to the hearing characteristics and the positions of the plurality of users in the display apparatus has been described in detail. A method for controlling hearing levels of a plurality of users in the hearing level control apparatus connected to the above-described external apparatus capable of outputting sound, will now be described in detail.

Figure 9:
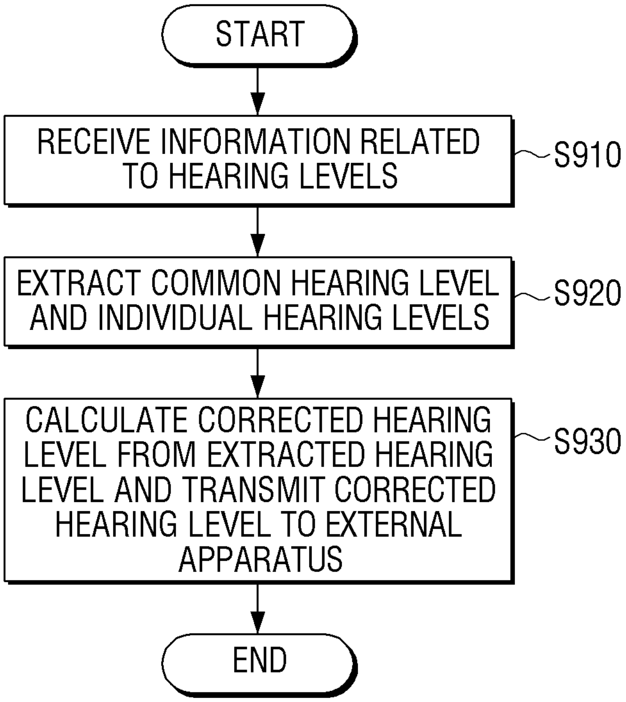
FIG. 9 is a flowchart illustrating a method for controlling hearing levels of a plurality of users in a hearing level control apparatus according to an exemplary embodiment.

FIG. 9 is a flowchart illustrating a method of controlling hearing levels of a plurality of users in the hearing level control apparatus, according to an exemplary embodiment.

Referring to FIG. 9, in operation S910, the hearing level control apparatus receives information related to the hearing levels of the plurality of users according to frequencies through communication with the external apparatus capable of outputting sound. Here, the information related to the hearing levels according to the frequencies is information about hearing levels of the plurality of users measured according to the frequencies. If the information related to the hearing levels of the plurality of users is received, the hearing level control apparatus normalizes the hearing levels of the plurality of users based on the received information. In operation S920, the hearing level control apparatus extracts a common hearing level and individual hearing levels from the normalized hearing levels of the plurality of users. In operation S930, the hearing level control apparatus calculates a corrected hearing level based on the common hearing level and the individual hearing levels of the plurality of users and transmits the corrected hearing level to the external apparatus.

In detail, the hearing level control apparatus calculates an average hearing level of the individual hearing levels of the plurality of users according to the frequencies and transmits the lowest of either the calculated average hearing level or the common hearing level to the external apparatus.

However, the exemplary embodiment is not limited thereto. Therefore, the hearing level control apparatus may calculate a weighted hearing level from a difference between the individual hearing levels corresponding to a preset condition or the average hearing level and transmit the lowest one of the calculated weighted hearing level and the common hearing level to the external apparatus. As described above, the hearing level control apparatus according to the exemplary embodiment may control the external apparatus to correct and output sound with which all of a plurality of users are satisfied, based on hearing levels of the plurality of users.

If position information of the plurality of users is received, the hearing level control apparatus calculates a weight ratio based on the position information of the plurality of users and position information of a plurality of speakers which are pre-stored and related to the external apparatus. The hearing level control apparatus adjusts the average hearing level or the weighted hearing level according to the calculated weight ratio.

In detail, the hearing level control apparatus compares the position information of each of the plurality of users with the position information of the first speaker of the plurality of speakers to calculate a first weight ratio of the individual hearing levels of the plurality of users and adjusts the average hearing level or the weighted hearing level output through the first speaker according to the first weight ratio. Also, the hearing level control apparatus compares the position information of each of the plurality of users with the position information of the second speaker of the plurality of users to calculate a second weight of the individual hearing levels of the plurality of users and adjusts the average hearing level or the weighted hearing level output through the second speaker according to the second weight ratio.

For example, the external apparatus capable of outputting the sound may output sound through the first speaker L and the second speaker R disposed on the left and right sides. Also, position information of the first speaker L and second speaker R may be pre-stored in the hearing level control apparatus. Therefore, if position information of user A and user B is received, the hearing level control apparatus may check which one of the first speaker L and the second speaker R is adjacent to each of user A and user B, based on the pre-stored position information of the first speaker L and the second speaker R and the position information of user A and user B.

According to an exemplary embodiment, if user A and user B are positioned in the center between the first speaker L and the second speaker R, the hearing level control apparatus may equally apply a weight ratio as 50:50. If the weight ratio is equally applied as described above, the hearing level control apparatus may compare the average hearing level or the weighted hearing level with the common hearing level to transmit a hearing level corresponding to the lowest hearing level to the external apparatus.

The user A may be in the position adjacent to the first speaker L, and the user B may be in the position adjacent to the second speaker R. In this case, the hearing level control apparatus may apply a weight ratio to the hearing level of the user A in the position adjacent to the first speaker L and a weight ratio to the hearing level of the user B in the position adjacent to the second speaker R. In detail, as shown in FIG. 5, if the user A is in the position adjacent to the first speaker L, the hearing level control apparatus may apply a ratio between the weights of the hearing levels of user A and user B as 75:25. Therefore, according to this weight ratio, the hearing level control apparatus may adjust the average hearing level to a hearing level approximate to the hearing level of the user A and compare the adjusted hearing level with the common hearing level to transmit a hearing level corresponding to the lowest hearing level to the external apparatus.

If the user B is in the position adjacent to the second speaker R, the hearing level control apparatus may apply the ratio between the weights of the hearing levels of user B and user A as 25:75. Therefore, according to this weight ratio, the hearing level control apparatus may adjust the average hearing level to a hearing level approximate to the hearing level of the user B and compare the adjusted hearing level with the common hearing level to transmit a hearing level corresponding to the lowest hearing level to the external apparatus.

As described above, the hearing level control apparatus controls the external apparatus to correct and output sound, corresponding to a hearing level with which all of a plurality users are satisfied, based on hearing characteristics of the plurality of users. Also, the hearing level control apparatus controls the external apparatus to appropriately correct and output sounds through a plurality of speakers of the external apparatus in consideration of positions of the plurality of users.

The foregoing exemplary embodiments and advantages are merely exemplary and are not to be construed as limiting. The teachings can be readily applied to other types of apparatuses and methods. Also, the description of the exemplary embodiments is intended to be illustrative, and not to limit the scope of the claims, and many alternatives, modifications, and variations will be apparent to those skilled in the art.

What is claimed is:

1. A display apparatus comprising:

an audio output unit configured to output an audible sound corresponding to an audio signal;

a storage configured to store face images of a plurality of users in association with hearing levels of the plurality of users, measured according to frequencies;

a photographing unit configured to capture a plurality of faces of the plurality of users; and a controller configured to read a plurality of hearing levels matching each of the captured plurality of faces of the plurality of users from the storage and to control, in response to identical hearing levels being extracted from the read hearing levels, the audio output unit to output the audio signal according to a lower hearing level between a hearing level of the extracted identical hearing levels and an average hearing level of remaining hearing levels.

2. The display apparatus of claim 1, further comprising:

a hearing level extractor configured to normalize the read plurality of hearing levels to extract a common hearing level and individual hearing levels measured according to the frequencies, wherein the controller is further configured to calculate an average hearing level of the individual hearing levels and to correct the audio signal as sound corresponding to a lowest one of the calculated average hearing level and the common hearing level.

3. The display apparatus of claim 2, wherein the controller is further configured to:

calculate a weighted hearing level based on a difference between one of the individual hearing levels corresponding to a preset condition and the average hearing level, and correct the intensity of the audible sound to correspond to a lowest one of the calculated weighted hearing level and the common hearing level.

4. The display apparatus of claim 3, further comprising:

a position information acquirer configured to acquire position information of the plurality of users from the plurality of face images, wherein the controller is further configured to adjust one of the average hearing level and the weighted hearing level according to a weight ratio calculated based on the position information of the plurality of users and position information of a plurality of speakers.

5. The display apparatus of claim 4, wherein the controller is further configured to:

compare the position information of each of the plurality of users with the position information of a first speaker of the plurality of speakers to calculate a first weight ratio of the individual hearing levels of the plurality of users, adjust one of the average hearing level and the weighted hearing level corresponding to an audible sound to be output through the first speaker according to the first weight ratio, compare the position information of each of the plurality of users with the position information of a second speaker of the plurality of speakers to calculate a second weight ratio of the individual hearing levels of the plurality of users, and adjust one of the average hearing level and the weighted hearing level corresponding to an audible sound to be output through the second speaker according to the second weight ratio.

6. A hearing level control apparatus configured to be connected to an external apparatus capable of outputting sound, the hearing level control apparatus comprising:

a communicator configured to communicate with the external apparatus to receive information related to individual hearing levels of a plurality of users measured according to frequencies;

a hearing level extractor configured to normalize the individual hearing levels of the plurality of users to extract a common hearing level and individual hearing levels of the plurality of users; and a controller configured to control, in response to identical hearing levels being extracted from the individual hearing levels, the communicator to transmit a lowest one of the extracted identical hearing levels and an average hearing level of remaining hearing levels to the external apparatus.

7. The hearing level control apparatus of claim 6, wherein the controller is further configured to calculate an average hearing level of the individual hearing levels and to control the communicator to transmit a lowest one of the calculated average hearing level and the common hearing level to the external apparatus.

8. The hearing level control apparatus of claim 7, wherein the controller is further configured to:

calculate a weighted hearing level based on a difference between one of the individual hearing levels corresponding to a preset condition and the average hearing level, and to transmit a lowest one of the weighted hearing level and the common hearing level to the external apparatus.

9. The hearing level control apparatus of claim 7, further comprising:

a storage configured to store position information of a plurality of speakers related to the external apparatus, wherein the controller is further configured to, if position information of the plurality of users is received, adjust the average hearing level according to a weight ratio calculated based on the received position information of the plurality of users and the position information of the plurality of speakers stored in the storage.

10. The hearing level control apparatus of claim 9, wherein the controller is further configured to:

compare the position information of each of the plurality of users with the position information of a first speaker of the plurality of speakers to calculate a first weight ratio of the individual hearing levels of the plurality of users, adjust the average hearing level corresponding to an audible sound to be output through the first speaker according to the first weight ratio, compare the position information of each of the plurality of users with the position information of a second speaker of the plurality of speakers to calculate a second weight ratio of the individual hearing levels of the plurality of users, and adjust the average hearing level corresponding to an audible sound to be output through the second speaker according to the second weight ratio.

11. A method for outputting an audible sound corresponding to an audible signal in a display apparatus, the method comprising: capturing a plurality of faces of a plurality of users of the display apparatus; generating a plurality of face images of the captured plurality of faces of the plurality of users; obtaining individual hearing levels associated with the corresponding generated plurality of face images from a storage, the storage storing face images of a plurality of users in association with hearing levels of the plurality of users, and the hearing levels being measured according to frequencies; outputting, in response to identical hearing levels being extracted from the obtained hearing levels, the audio signal according to a lower hearing level between a hearing level of the extracted identical hearing levels and an average hearing level of remaining hearing levels.

12. The method of claim 11, further comprising:

normalizing the obtained individual hearing levels to extract a common hearing level and individual hearing levels measured according to the frequencies, wherein the outputting the audio signal comprises calculating the average hearing level of the individual hearing levels;

correcting an intensity of the audio signal as sound to correspond to the lowest one of the average hearing level and the common hearing level; and outputting the corrected audible signal.

13. The method of claim 12, further comprising:

calculating a weighted hearing level based on a difference between one of the individual hearing levels corresponding to a preset condition and the average hearing level wherein the correcting comprises correcting the intensity of the audible sound to correspond to a lowest one of the weighted hearing level and the common hearing level.

14. The method of claim 13, further comprising:

acquiring position information of the plurality of users from the plurality of face images, and adjusting one of the average hearing level and the weighted hearing level according to a weight ratio calculated based on the position information of the plurality of users and position information of a plurality of speakers.

15. The method of claim 14, wherein the outputting the audio signal comprises:

comparing the position information of each of the plurality of users with the position information of a first speaker of the plurality of speakers to calculate a first weight ratio of the individual hearing levels of the plurality of users;

adjusting one of the average hearing level and the weighted hearing level corresponding to an audible sound to be output through the first speaker according to the first weight ratio; and comparing the position information of each of the plurality of users with the position information of a second speaker of the plurality of speakers to calculate a second weight ratio of the individual hearing levels of the plurality of users; and adjusting one of the average hearing level and the weighted hearing level corresponding to an audible sound to be output through the second speaker according to the second weight ratio.

16. A method for controlling hearing levels of a plurality of users in a hearing level control apparatus connected to an external apparatus capable of outputting sound, the method comprising:

communicating with the external apparatus to receive information related to individual hearing levels of the plurality of users measured according to frequencies;

normalizing the individual hearing levels of the plurality of users to extract a common hearing level and individual hearing levels of the plurality of users; and transmitting to the external apparatus, in response to identical hearing levels being extracted from the individual hearing levels, a lower hearing level between a hearing level of the extracted identical hearing levels and an average hearing level of remaining hearing levels.

17. The method of claim 16, further comprising:

calculating an average hearing level of the individual hearing levels; and wherein transmitting the hearing level comprises transmitting the lowest one of the average hearing level and the common hearing level to the external apparatus.

18. The method of claim 16, further comprising:

comprises calculating a weighted hearing level based on a difference between one of the individual hearing levels corresponding to a preset condition and the average hearing level, wherein the transmitting comprises transmitting a lowest one of the weighted hearing level and the common hearing level to the external apparatus.

19. The method of claim 17, further comprising:

adjusting, if position information of the plurality of users is received, the average hearing level according to a weight ratio calculated based on the received position information and stored position information of a plurality of speakers related to the external apparatus.

20. The method of claim 19, further comprising:

comparing the position information of each of the plurality of users with the position information of a first speaker of the plurality of speakers to calculate a first weight ratio of the individual hearing levels of the plurality of users;

adjusting the average hearing level corresponding to an audible sound to be output through the first speaker according to the first weight ratio;

comparing the position information of each of the plurality of users with the position information of a second speaker of the plurality of speakers to calculate a second weight ratio of the individual hearing levels of the plurality of users; and adjusting the average hearing level corresponding to an audible sound to be output through the second speaker according to the second weight ratio.

21. The display apparatus of claim 2, wherein the common hearing level corresponds to a hearing level at which the plurality of users have the same hearing characteristic at a same frequency.

22. The display apparatus of claim 21, wherein the controller is further configured to calculate a plurality of average hearing levels for a plurality of frequencies of the frequencies.

23. The display apparatus of claim 22, wherein the controller is further configured to correct an intensity of the audible sound over the frequencies to correspond to a lowest one of a lowest average hearing level from among the plurality of frequencies and the common hearing level.

* * * * *